United States Patent [19]

Kowalczyk

[11] 4,319,184

[45] Mar. 9, 1982

[54] REMOTE CONTROL PRECISION STEP ATTENUATOR

[76] Inventor: Walter Kowalczyk, 1449 Jeffery Dr., North Huntingdon, Pa. 15642

[21] Appl. No.: 181,118

[22] Filed: Aug. 25, 1980

[51] Int. Cl.³ .............................................. G05F 3/02
[52] U.S. Cl. ............................... 323/354; 333/81 R; 340/782; 455/92
[58] Field of Search ....................... 323/297, 352–354; 333/81 R; 340/782; 455/92

[56] References Cited

U.S. PATENT DOCUMENTS

| | | | |
|---|---|---|---|
| 3,011,132 | 11/1961 | Hinrichs et al. | 323/354 |
| 3,243,691 | 3/1966 | Gibson et al. | 323/353 |
| 3,858,128 | 12/1974 | Mullin | 333/81 R |
| 4,211,956 | 7/1980 | Bloyd | 340/782 |

*Primary Examiner*—William H. Beha, Jr.

*Attorney, Agent, or Firm*—Richard L. Miller

[57] ABSTRACT

A remote control precision step attenuator for providing a desired amount of attenuation in the transmission channel of an audio signal. The attenuator includes a counter which provides a binary output count representative of the desired attenuation. An input applied to the counter can cause a stepwise increment or decrement to the output count of the counter. A control circuit responds to the binary output count in order to produce an attenuation control signal. Attenuation circuitry, coupled within the transmission channel is controlled by the attenuation control signal in order to apply the desired amount of attenuation into the channel. The attenuation circuit can be a resistance pad having sections each of which are switched into and out of the transmission channel by relays responding to the counter binary count output.

7 Claims, 3 Drawing Figures

REMOTE CONTROL PRECISION STEP ATTENUATOR

BACKGROUND OF THE INVENTION

This invention relates to an attenuator and more particularly to an attenuator which can be remotely controlled in a stepwise manner to permit placement within a broadcast transmission system to thereby control the modulation level of the audio signal.

In a broadcast transmission system there is typically provided a modulation limiter circuit which is connected to the transmitter for sending out the audio signal. In order to control the modulation level, an attenuator is generally placed between the modulation limiter and the transmitter. Most of these attenuators require direct control at the broadcast station. However, more recently there has become a need for remote control systems for remotely setting the modulation level.

In order to provide such remotely controlled attenuation, there has been utilized devices such as a mechanical potentiometer or a rotary attenuator. A reversible motor is utilized to operate such devices. However, these systems have the disadvantage of including backlash, imperfect tracking between channels in a multichannel installation, poor impedance match and impedance variation, and other technical problems. Additionally, and perhaps of most importance, is that the operator is not able to control the attenuation in known, precise small increments. In utilizing such prior art remote control attenuators a raise or lower button is initiated and the attenuator is operated in a trial and error fashion until the desired attenuation is achieved.

Such systems of modulation control utilize a control button which continuously operates during the length of time that the button is energized. As long as the button is depressed, the modulation level continues to change. During the length of time that the control button is depressed, the oscillator continues to raise or lower the value and thereby continuously feed the variation to the system. However, here too the individual cannot accurately determine the modulation level that he desires since there is such continuous ongoing changes.

Accordingly, there is need for a remote control precision step attenuator which provides precise stepwise increments or decrements of the modulation level within small tolerance values. Such system should also provide excellent channel tracking while permitting multiple channels to operate. Impedance variation should be constant and backlash should be avoided.

SUMMARY OF THE INVENTION

It is accordingly an object of the present invention to provide an attenuation system which avoids the aforementioned problems of prior art devices.

Yet another object of the present invention is to provide a remote control precision step attenuator.

A further object of the present invention is to provide a system which permits digital remote modulation control of a transmission channel.

Still another object of the present invention is to provide a remote control precision step attenuator utilizing only passive elements within the transmission path.

Still a further object of the present invention is to provide a remote control precision step attenuator which permits a visual display of the amount of attenuation applied to the transmission path.

A further object of the present invention is to provide a remote control precision step attenuator capable of applying attenuation over a fixed range of values and providing a midband value of attenuation upon initializing, resetting, or power failure.

Another object of the present invention is to provide a remote control precision step attenuator which can provide precise stepwise increments of attenuation in small precise steps.

Still another object of the present invention is to provide a remote control precision step attenuator which can be controlled manually or automatically at a remote location.

A further object of the present invention is to provide a remote control precision step attenuator whose initial attenuation value can be prefixed at a desired level.

Briefly, in accordance with the present invention, there is provided a remote control precision step attenuator for providing a desired amount of attenuation in the transmission channel of an audiosignal. The attenuator includes a counter which provides a binary output count representative of the desired amount of attenuation. An input circuit is connected to the counter for causing a stepwise increment or decrement to the output count from the counter. A control circuit responds to the binary output count and produces an attenuation control signal. Attenuation circuits coupled within the transmission channel are controlled by the attenuation control signals and in response thereto applies the desired amount of attenuation into the channel.

In an embodiment of the invention, the attenuation circuit includes a resistance pad having a plurality of interconnected sections. Each of the sections of the pad includes some series resistors, some parallel resistors, a series resistance interconnecting switch and a parallel resistance interconnecting switch. The control circuit includes a corresponding plurality of relays with each relay respectively controlling the two switches in a corresponding pad section. There are also provided a corresponding plurality of gates. Each of the gates is operated by a predetermined binary output from the counter and in turn controls the energization of a corresponding relay. In this manner, a particular binary output count operates selected ones of the gates to thereby energize corresponding ones of the relays which in turn operate the switches in the corresponding pad sections. As a result, the amount of resistance placed in the transmission channel is controlled to thereby apply the desired attenuation.

The foregoing objects, features and advantages of the invention will, in part, be pointed out with particularity, and will, in part, become obvious from the following more detailed description of the invention, taken in conjunction with the accompanying drawings, which form an integral part thereof.

BRIEF DESCRIPTION OF THE DRAWINGS

In the drawings.

In the various figures of the drawing, like reference characters designate like parts.

DESCRIPTION OF THE PREFERRED EMBODIMENT

Figure 1:
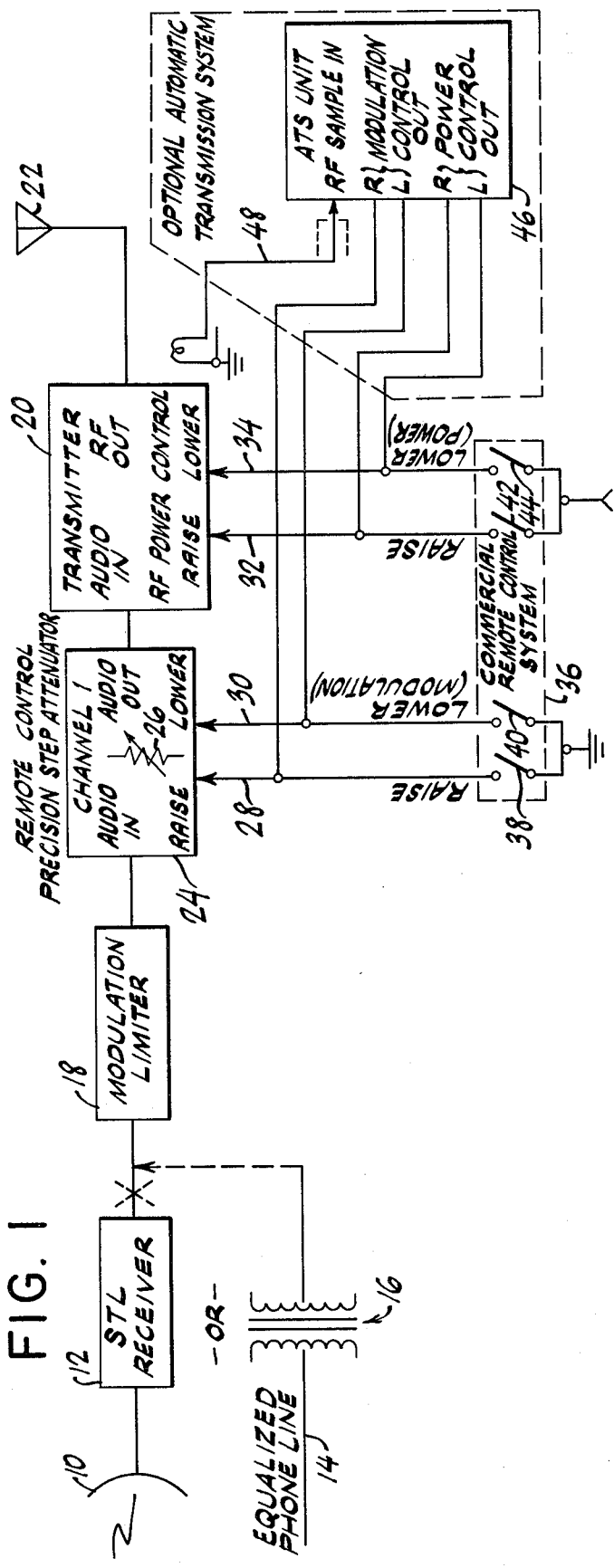
FIG. 1 is a block diagram of a typical broadcast application of the invention.

Referring now to FIG. 1, there is shown a typical installation of a broadcast transmitter plant utilizing the remote control precision step attenuator of the present invention. The installation includes standard equipment for receiving the signal which may either include the antenna 10 connected to a receiver 12, or alternately the signal may be received from an equalized phone line 14 passing through the transformer 16. In either event, the signal is provided to a modulation limiter 18 which normally feeds a transmitter 20 to send out a signal through the antenna 22. In order to control the modulation level, a remote control precision step attenuator 24 of the present invention is included. As is shown by the symbol 26, the attenuator included within the transmission line only contains passive elements, and specifically resistance elements. By means of a signal on line 28 or 30, the value of the attenuation can be raised or lowered, respectively. Although only one channel is shown, it is understood that two or more channels can typically be utilized and all channel would have common control from the remote control system.

Typically, the transmitter is also remote controlled by means of the line 32, 34, which respectively raise or lower the value of power to the system.

The entire installation can be controlled by the commercial remote control system 36 positioned at a distance from the transmitter plant. There would be included the raise and lower modulation switches 38, 40 and the raise and lower power switches 42, 44. In connection with the power system, typically the unit provides for 120 VAC switching, or sometimes ground switching or some other voltage. These systems are typically motor operated potentiometers, rheostats or varics.

More recently, the use of automatic transmission systems, shown generally at 46, have been utilized at broadcast stations. Such systems feed in an RF sample on line 48 and automatically control the modulation as well as the power. Utilizing the remote control precision step attenuator of the present invention, automatic control can be achieved and adjusted in precise small level steps until the correct level has been achieved. A pulse would be provided for each step change desired. If existing systems provide continuous contact closure until correct modulation is achieved, a pulse oscillator can be included to operate the present unit in a stepwise manner.

The commercial remote control system can provide access to one telemetering channel at a time by numerical selection. It can also provide isolated relay contacts for each channel. If switching is required at a particular voltage level, the present unit can be used with interfacing relays or opto-isolators provided to switch the raise and lower inputs to ground, when a remote command is given.

Figure 3:
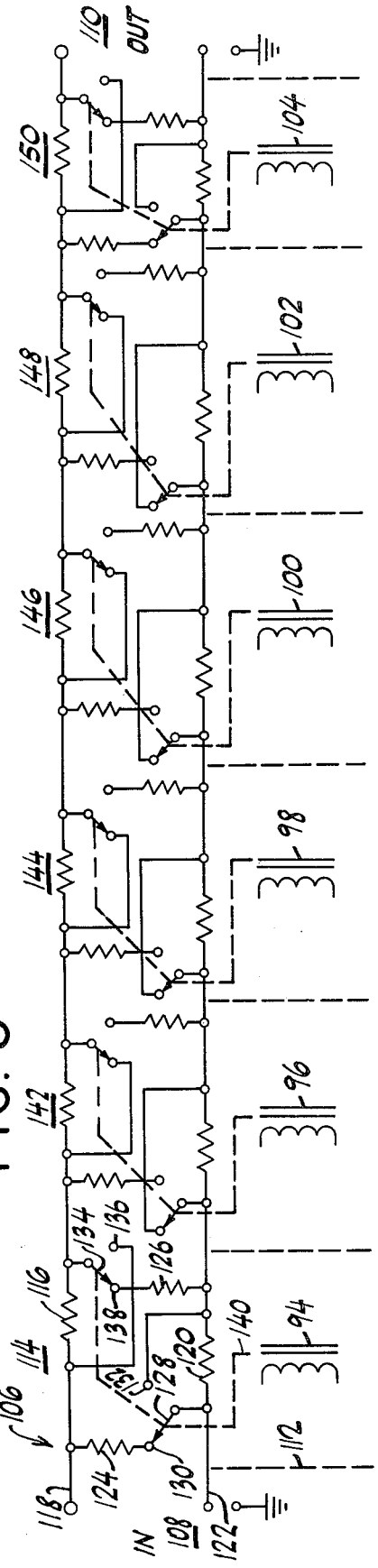
FIG. 3 is a schematic diagram of the relay pad circuitry, shown in its de-energized state.
Figure 2:
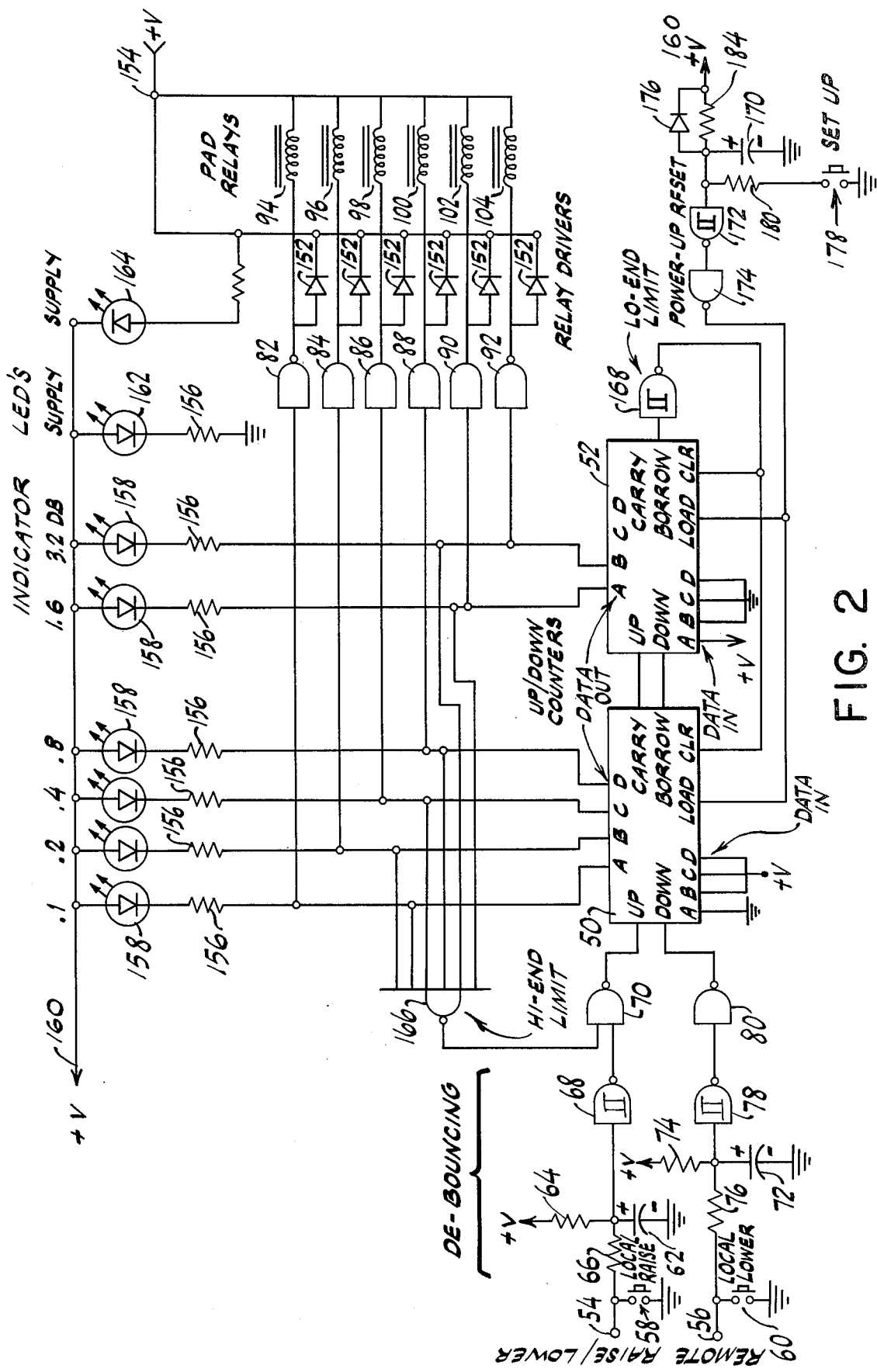
FIG. 2 is a schematic diagram of the invention.

The remote control circuitry for the remote control precision step attenuator is shown in FIG. 2 and the particular attenuation resistances which are placed in series in the transmission channel are shown in FIG. 3. The unit is based upon the theory that any number can be represented by the two states of the binary numbers (1 and 0) and that these two states can be represented electrically by the ON and OFF states. The desired attenuation to be included in the transmission channel can therefore be represented by a binary number and each binary digit, or bit, is used to switch a specified amount of resistance contained within a resistance pad either into or out of the audio path from input to output.

The decibel attenuation values of the individual sections of the pads are positive, whole number powers of two multiplied by a scaling factor. By way of example, in the present application, the scaling factor is 1/10 in order to provide a series of attenuation levels of 0.1 DB. per step resolution. Thus, utilizing the binary values of $2^0, 2^1, \ldots 2^5$, multiplied by the scaling factor of 1/10, gives individual pad sections attenuation values of 0.1, 0.2, ... 3.2 DB. which can be individually switched in as necessary in order to add up to the desired attenuation. This provides a control range of 0 to 6.3 DB in 0.1 DB steps if desired. It should be understood, that other ranges could also be utilized.

Presettable up/down binary counters 50, 52 are used to generate and store the binary numbers which represent the desired attenuation. Typically, TTL counter chips can be utilized. The outputs are shown at the upper portion and designated by the letters ABCD and the inputs are shown at the bottom and also designated by the letters ABCD. In the present example, the binary number is at a maximum ($111111 = 63_{10}$) which corresponds to maximum modulation level or zero attenuation. On the other hand, binary zero represents minimum modulation, or maximum attenuation (6.3 DB). The reason for such setting is that "Glitches" or very brief supply dropouts, are more like to reset the counters to zero than to load them to a maximum count, and slightly low modulation is preferred to overmodulation. As a result, the zero count was chosen to represent maximum attenuation.

The present system is provided with a preset input. Specifically the input to counter 50 has its A tied to zero or ground level, while a voltage is applied to the B C and D inputs. The binary counter 52 has its A provided with the high voltage and its B C and D inputs, tied to ground. As a result, when power is initially applied, or when the "set-up" button is pressed, as will hereinafter be explained, binary 011110 is loaded into the counters. This value sets the attenuation at approximately mid band or at a value of 3.3 DB.

The remote raise/lower button is shown to include the raise terminal 54 and the remote lower terminal 56. A local raise button 58 is also provided as is likewise provided a local lower button 60. Normally, capacitor 62 is kept charged at the plus V voltage level through the resistor 64. When the remote raise receives a signal, or when the local raise 58 is pressed, capacitor 62 discharges through resistor 66 to ground through the switch placing a logic zero, or low level, on the input of Schmitt Trigger NAND gate 68 causing its output to go to a logic 1 or high level. This is inverted by the gate 70 to provide a low level on the up input to the counter 50.

A similar situation occurs when the lower button 60 is depressed or when a lower remote signal arrives on the terminal 56. The normally charged capacitor 72 which receives the voltage through the resistor 74 will discharge through the resistor 76 when the button is depressed so as to place a logic zero or low level, on the input of the Schmitt Trigger NAND 78 causing its output to go to a logic 1 or high level. This is also inverted by the gate 80 to provide a low level signal to the down input of the counter 50.

Accordingly, when the raise button or lower button is utilized, either locally or by remote control, no matter how long the button is kept down, only a single pulse will be provided to the counter so that the count is incremented or decremented by a single count. In the present example, the change will be by a 0.1 DB level. Each time the button will be depressed, the count will change by such 0.1 DB attenuation level. As a result, exact and accurate control can be had of the attenuation level desired in stepwise manner.

Regular TTL inputs have no hysteresis and recognize only a logic level change as the input voltage passes through a fixed value, such as 0.8 V. On the other hand, a Schmitt Trigger TTL input, however, recognizes a low to high transition when the input voltage changes above a value, such as 1.7 V, and, once high, will remain so until the voltage is taken below a second threshold level such as 0.9 V, the point where a high to low transition is recognized. This characteristic, along with the charge/discharge time constant of the input RC network, eliminates the effects of contact bounce.

The up/down counters 50, 52 require that their up and down inputs normally be held high. Accordingly, they increment or decrement when the appropriate input goes high after having been taken low. Since the Schmitt Trigger NAND gates 68, 78 inputs are held normally high to permit ground switching, the usual TTL practice, their outputs are normally low which in turn are inverted by the inverters 70, 80 to meet the requirement of producing a high at the up and down inputs to the counter 50.

Each of the counters 50, 52 can typically count up to 15, but the carry and borrow outputs permit cascading so that subsequent chips can count and store high order bits. These outputs are normally high, but the carry output will go low when the up input is taken low while the stored count is 15. When the up input returns to high, the carry output follows, while the count goes from 15 to zero and the following counter is incremented. The borrow output operates similarly, going low when the down input is taken low while the stored count is zero. When the down input returns to high, the borrow output follows while the count goes from zero to 15, and the following counter is decremented.

In the embodiment shown, counter 50 counts and stores the four least significant bits while counter 52 receiving the carry/borrow outputs from counter 50, counts and stores the two more significant bits. The two most significant bits, C and D, are not used and are actually held at a low level value.

The six outputs from the counters 50, 52 are applied to a series of gates 82-92. These gates in turn control the energization of the pad relays 94-104. Each of the relays in turn controls an individual section of the resistor pad, to be hereinafter described in connection with FIG. 3. A zero, or low level output from the binary counter is indicative of the presence or in-line connection of the resistance in that pad section while a 1 or high level indicates that the resistance of that pad section is not included, or is out of line. The gates 84, 86, 88 and 90 are non inverting gates whose output is open when the input is high, and switches to ground when the input is low. On the other hand, the two outermost gates, 82, 92 are inverting gates whose output is open when the input is low and switches to ground when the inputs are high.

Referring now to FIG. 3, there is shown the pad of resistance, 106, which is connected between the input audio 108 coming from the modulation limiter and provides an output audio 110 which is sent to the transmitter. It should be noted that only passive elements, rather than active elements, and specifically resistors are included in the pad. The resistances are divided up into sections, designated between the dashed lines 112, with each section controlled by a respective relay.

Referring to the first section 114, it will be noted that there is included a series resistor 116 connected to the one input line 118, and a corresponding resistor 120 connected in the line 122. Connected in parallel across the lines 118, 122 is a first resistor 124, and a second resistor 126. A first switch 128 has two terminals 130, 132 available for its contact. A second switch 134 likewise has two terminals 136, 138 available for its contacting. The two switches 128, 134 are ganged together and are controlled by energization of the relay 94 as shown by the dashed line 140.

The switches in the section 114 are initially connected so that the switch 128 is at its contact 130 thereby including both the parallel resistor 124 and the series resistor 120. Likewise the switch 134 is connected to its terminal 138 so as to place in-line the parallel resistor 126 and the series resistor 116. Upon operation of the relay 94, the two switches 128, 134 will move to the other positions, 132, 136, to thereby remove or place out of line all of the resistors.

All of the other sections of the pad have similar series and parallel resistors and similar switches with the switches of each section controlled by the corresponding relay. However, it should be noted that in the other sections, for example section 142, the switches are so arranged that the resistors are out of line. In looking at FIG. 3, it will be noted that only the first and last sections 114, 150 are arranged with the switches in a normal position so as to place the corresponding resistors in line. The other sections, 142-148 are connected so that in their normal position, the resistors are out of line. Each of the sections of the pad provides a progressively increasing binary amount of attenuation. For example, the first section 114 provides 0.1 DB of attenuation, section 142 provides 0.2 DB level of attenuation and so on until the final section 150 provides an attenuation of 3.2 DB.

With the first and last sections normally in line, the pad will provide an initial resistance of 3.3 DB or approximately mid range, with the relays in a de-energized position. As heretofore explained, this provides increased reliability. Thus, in the event of power supply failure to the unit, the attenuation will be near the center of the unit's range and at the level used when initial limiter output level adjustments are made. Accordingly, when the unit is initialized, reset, or in the event of a power supply failure, or whenever the relays are de-energized, there will be provided a midband value of attenuation of 3.3 DB.

As heretofore explained, a zero output from the binary counter represents the presence or inline of the resistors in that section while a high level output from the counter represents out of line resistors of that section. Since the pad is wired so that the first and last sections are initially in line, the counters are also preset with the value corresponding to the attenuation of 3.3 DB. For this reason, the gates 82-92 must also be of the type to permit accommodation of this initial value and maintain the relays de-energized with the initial values from the counter. Since the first and last, or the 0.1 and the 3.2 DB pads are in line with no power applied to the unit, inverting gates are used for the first and last sections 82, 92. In this way, low bits at power up condition will not energize the corresponding relays 94, 104. the remaining gates 84-90 are non inverting so that the high bits at power up condition do not energize the corresponding relays 96-102 causing the pads to remain in an out of line condition. Thus, no special requirements are made on the count sequence to implement this reliability increasing feature.

Each of the gates 82-92 has a diode 152 interconnected between its output and the high level voltage V+ applied at 154. It should also be noted that one end of the pad relays are each connected to the voltage supply 154 and are energized when the other end is connected to a low level output of the corresponding gate.

The 6 output control bits from the binary counters 50, 52 are also used to energize a display indicating the amount of attenuation included within the line. Specifically, each of the output lines are connected through a current limiting resistor 156 to a light emitting LED 158 to indicate which pads are in the audio circuit. The LEDs light up when the respective bits are low, indicating pad in-line in all cases. The other end of the LED is connected to the power supply at 160. Accordingly, the six indicator LEDs provide a corresponding indication of attenuation from 0.1 DB until 3.2 DB. There are also provided the additional LEDs 162, 164, which are used to show the ON condition and to show the presence of the power supplies.

The 6 outputs from the counters 50, 52 are also applied to NAND gate 166. When one or more of its inputs is low, which is normally the case, its output is high. This high level output is applied as a second input to the NAND gate 70 enabling it to pass the "raise" pulses. However, when the counters 50, 52 have counted to their maximum number, all of the outputs will be high which means that all of the inputs to gate 166 are high and its output goes low thereby preventing the gate 70 from passing any more "raise" commands. Accordingly, the NAND gate 166, together with NAND gate 70, serves as a high end limit switch preventing any further increment of the counters once they have reached their upper maximum count.

A low end limit is also provided. When the count of the counters 50 and 52 is at zero, and the input down is taken low, the borrow output also goes low. When both counters 50 and 52 are therefore at their zero count, their borrow outputs go low if a further lower command is attempted. This low is then inverted by gate 168 to put a high on the clear inputs of both counters 50 and 52 which keeps them from counting because there is sufficient propogation delay through counters 50 and 52, so that the clear inputs will remain high for several nano seconds after counter 50's down input returns high. The counters 50, 52 require a high on its clear input to reset the count to zero. Normally, this pin is kept at a low level.

The circuit shown in FIG. 2 also provides a power-up preset feature. When power is initially applied, the capacitor 170 is initially discharged. This places a low level signal on the input to the Schmitt Trigger NAND gate 172. The output of gate 172 is then high and is inverted back to low by gate 174. This sends a low level signal onto the "load" input of the counters 50, 52 which presets the counter outputs to the logic levels present as a result of the preset value of the data input. This will program the output count to represent a 3.3 DB. attenuation which corresponds to the prefixed pad resistor sections as described in connection with FIG. 3.

After capacitor 170 charges to above a threshold value, as for example 1.7 V, gate 172 detects a high level at its input which causes a high to be applied to the "load" input of the counters 50, 52 disabling the preset function. However, in the event of a power failure the diode 176 speeds the discharge of capacitor 170 so that the feature will operate if the interruption is brief. The set-up button 178 is provided to operate similar to that of a power interruption. Specifically, when it is pressed, it also discharges capacitor 170 through resistor 180 to cause the same preset sequence thereby returning the attenuation to the 3.3 DB value when adjusting the output level of the preceeding modulation limiter. This is done to assure that the level will be correct, or nearly so, at the attenuation the unit will provide if power to it fails, and after return from a power interruption. Normally, the capacitor 170 is charged by the power supply 160 through the resistor 184.

When the present unit is utilized as part of a remote broadcast transmitter modulation level control at an unmanned site, floating 600 ohm balance "0" pads are used in cascade to provide the attenuation. Each pad can be connected to a DPDT relay contact arranged in such a manner that the audio path is not broken as the relay armature moves from its de-energized to its energized position. This is accomplished by shorting (or leaving unshorted) the series resistors, and disconnecting (or connecting) the shunt resistors in the out (in) positions, respectively, of the relay contacts. Four pole double throw relays can also be used, with two identical pads per relay, to provide perfect tracking of two independent channels, for redundant program feeds or stereo operation. The pads are in progression from least to most attenuation, with the highest being just ahead of the audio output terminals to give the best noise performance.

Since there is no active circuitry being used in the audio path, power loss will cause no loss of audio. No active circuitry also means no phase shift or frequency response abberations to introduce peaks not contained in the limiter's clipped output. By limiting the range, as for example to 6.3 DB in the event of failures, modulation would not be radically low or high.

For utmost reliability, and avoidance of generating false peaks on clipped audio, as well as to provide an audio circuit that is floating with respect to ground as is the usual broadcast practice, no active circuitry is used in the audio path. However, in applications where these factors are unimportant, the present invention could be implemented by applying the binary number representing attenuation to a digital to analog converter, whose output voltage would vary the gain of a voltage controlled amplifier or attenuator. Additionally, digitally controlled analog switch chips could be used to switch pads into or out of the circuit in a manner similar to the operation of the relays as aforedescribed.

For other applications requiring greater or less control range or resolution, the scaling factor and/or the number of pads with control relays may be increased or decreased to give any desired range and resolution. If a different range or resolution is used, the power up/setup function can be programmed to any other starting value as desired. In such cases the wiring of the pads would have to be modified and similarly the use of inverting or non inverting gates for controlling the pad relays would also have to be changed.

In an embodiment of the invention, the following circuit chips were utilized for various ones of the functions described.

Specifically, the up/down counters were 74193 type chips; the Schmitt Triggers were 74132 type chips, the gates for driving the pad relays were high current, high voltage open collector output relay drivers with the inverting type being 75452 chips and the non inverting type being 75451 type. The high end limit gate can be a 7430 type gate with the other inverting gates being 7400 type chips. It should be appreciated that these IC type numbers are "generic" with the manufacturer's prefixes and suffixes omitted. However, any type manufacturer's product could be utilized for such chips.

Instead of utilizing the LED display, it may be preferred to provide a direct digital display of attenuation. This digital display can be implemented by feeding the outputs from the counters to a type 74185 binary-to-BCD converter chip. The BCD output can then feed any available readout decoder chips which then drive the numeric display.

The particular pad resistors had the following values:

| | PAD RESISTORS | |
|---|---|---|
| DB | Series Resistor | Parallel Resistor |
| 0.1 | 3.6 ± 5% | 100K ± 5% |
| 0.2 | 6.8 ± 5% | 51K ± 5% |
| 0.4 | 13.7 ± 1% | 26.1K ± 1% |
| 0.8 | 27.4 ± 1% | 13K ± 1% |
| 1.6 | 56.2 ± 1% | 6490 ± 1% |
| 3.2 | 113 ± 1% | 3320 ± 1% |

In the embodiment described, channel tracking was almost perfect within a small tolerance and the number of channels could be increased at will by using relays with more poles or paralleling relay coils to provide additional channels. Impedance variation over the entire control range was measured to better than ±¼% and there was no backlash.

Although the invention was described in connection with a broadcast application, the invention could also be adapted to provide a precision tracking volume control for a stereo high fi system. Other uses could also be provided.

There has been described heretofore the best embodiments of the invention presently contemplated. However, it is to be understood that various changes and modifications may be made thereto without departing from the spirit of the invention.

I claim:

1. A remote control precision step attenuator for providing a desired amount of attenuation in the transmission channel of an audio signal comprising:

counter means for providing a binary output representative of the desired attenuation;

input means coupled to said counter means for causing a stepwise increment or decrement to the output count of the counter means;

control means responsive to the binary output count for producing an attenuation control signal;

attenuation means coupled within the transmission channel and controlled by said attenuation control signal for applying the desired amount of attenuation into the channel, said attenuation means comprising a pad having a plurality of interconnected sections, each section having series resistance means, parallel resistance means, series resistance interconnecting switch means, and parallel resistance shorting switch means;

said control means comprising a corresponding plurality of relay means, each relay means respectively controlling the two switch means in its corresponding pad section, and a corresponding plurality of gating means, each gating means being operated by a predetermined binary output from said counter means for controlling the energization of a corresponding relay means; and certain of said pad sections of said attenuation means having their respective switch means normally open, and other sections having their respective switch means normally closed, so as to provide a prefixed de-energized amount of attenuation, whereby a particular binary output count operates selected ones of said gating means to energize corresponding ones of said relay means to thereby operate the switch means in the corresponding pad sections so as to control the amount of resistance in the transmission channel to apply the desired attenuation thereto.

2. A remote control precision step attenuator as in claim 1, and further comprising display means coupled to said counter means for displaying the amount of attenuation applied within the channel.

3. A remote control precision step attenuator as in claim 1, wherein said counter means is initialized to provide, upon resetting, a binary count output corresponding to the prefixed de-energized amount of attenuation, and said gating means includes means for maintaining all said relay means in a de-energized state in response to an initialized binary count output.

4. A remote control precision step attenuator as in claim 3, and further comprising reset means responsive to a start up signal as well as to the occurrence of a power interrupt, for resetting said counter means to its initialized value to thereby provide said de-energized amount of attenuation.

5. A remote control precision step attenuator as in claim 1, and further comprising a high-end limit circuit coupled to said counter means for preventing further incrementing of said counter means above a predetermined upper value of the binary count output.

6. A remote control precision step attenuator as in claim 1, and further comprising a low-end limit circuit coupled to said counter means for preventing further decrementing of said counter means below a determined lower value of the binary count output.

7. A remote control precision step attenuator as in claim 1, wherein said input means provides discrete pulses to said counter means whereby said counter means output count can be controlled in a stepwise manner.

* * * * *